(12) United States Patent
Wang

(10) Patent No.: US 12,501,817 B2
(45) Date of Patent: Dec. 16, 2025

(54) QUANTUM DOT DEVICE, DISPLAY APPARATUS, AND MANUFACTURING METHOD FOR QUANTUM DOT DEVICE

(71) Applicant: BOE Technology Group Co., Ltd., Beijing (CN)

(72) Inventor: Haowei Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 191 days.

(21) Appl. No.: 17/908,398

(22) PCT Filed: Oct. 22, 2021

(86) PCT No.: PCT/CN2021/125845
§ 371 (c)(1),
(2) Date: Aug. 31, 2022

(87) PCT Pub. No.: WO2022/127379
PCT Pub. Date: Jun. 23, 2022

(65) Prior Publication Data
US 2024/0032319 A1    Jan. 25, 2024

(30) Foreign Application Priority Data

Dec. 17, 2020  (CN) .......................... 202011495172.2

(51) Int. Cl.
*H10K 71/00* (2023.01)
*C09K 11/02* (2006.01)
(Continued)

(52) U.S. Cl.
CPC ............ *H10K 71/00* (2023.02); *C09K 11/025* (2013.01); *G03F 7/0757* (2013.01); *G03F 7/11* (2013.01);
(Continued)

(58) Field of Classification Search
None
See application file for complete search history.

(56) References Cited

U.S. PATENT DOCUMENTS

2014/0035011 A1* 2/2014 Chen .................... H10D 64/035
257/288
2014/0206182 A1 7/2014 Chen et al.

FOREIGN PATENT DOCUMENTS

CN          101076880 A       11/2007
CN          101512754 A        8/2009
(Continued)

OTHER PUBLICATIONS

CN202023079819.1 first office action.
CN202023079819.1 second office action.
CN 202011495172.2 first office action dated Nov. 11, 2024.

*Primary Examiner* — Anthony Ho
(74) *Attorney, Agent, or Firm* — IPro, PLLC

(57) ABSTRACT

Disclosed are a quantum dot device, a display apparatus, and a manufacturing method for a quantum dot device. The quantum dot device includes: a substrate assembly; a first fixing layer, the first fixing layer being located on one side of the substrate assembly and having silane coupling agents with multi coordinate bonds, and first connection structures being provided between the first fixing layer and the substrate assembly; a quantum dot film layer, the quantum dot film layer being located on the side of the first fixing layer away from the substrate assembly and having a plurality of pattern portions, the pattern portions having quantum dots, and second connection structures being provided between the pattern portion and the first fixing layer.

20 Claims, 9 Drawing Sheets

(51) Int. Cl.
   *G03F 7/075*   (2006.01)
   *G03F 7/11*    (2006.01)
   *H10K 50/115*  (2023.01)
   *H10K 71/12*   (2023.01)
   *H10K 85/10*   (2023.01)
   *H10K 85/40*   (2023.01)
   *B82Y 20/00*   (2011.01)
   *B82Y 40/00*   (2011.01)
   *H10K 50/16*   (2023.01)

(52) U.S. Cl.
   CPC ........... *H10K 50/115* (2023.02); *H10K 71/12* (2023.02); *H10K 85/10* (2023.02); *H10K 85/40* (2023.02); *B82Y 20/00* (2013.01); *B82Y 40/00* (2013.01); *H10K 50/16* (2023.02)

(56) References Cited

FOREIGN PATENT DOCUMENTS

| | | |
|---|---|---|
| CN | 108075043 A | 5/2018 |
| CN | 111769200 A | 10/2020 |
| CN | 111785843 A | 10/2020 |
| CN | 112071998 A | 12/2020 |
| CN | 216671683 U | 6/2022 |

* cited by examiner

QUANTUM DOT DEVICE, DISPLAY APPARATUS, AND MANUFACTURING METHOD FOR QUANTUM DOT DEVICE

CROSS REFERENCE TO RELATED APPLICATIONS

The present application is a US National Stage of International Application No. PCT/CN2021/125845, filed on Oct. 22, 2021, which claims priority to Chinese patent application No. 202011495172.2 filed on Dec. 17, 2020 to the China Patent Office, and entitled "QUANTUM DOT DEVICE, DISPLAY APPARATUS, AND MANUFACTURING METHOD FOR QUANTUM DOT DEVICE", the entire content of which is incorporated herein by reference.

FIELD

The present disclosure relates to the technical field of semiconductors, in particular to a quantum dot device, a display apparatus and a manufacturing method for a quantum dot device.

BACKGROUND

Semiconductor quantum dots are important fluorescent nano materials. Applying the quantum dots to the fields of panel illumination and photoelectric display as materials of the light emitting layer has attracted more and more attention from academia and industry. Up to now; in the aspect of device performance, external quantum efficiency (EQE) of the quantum dot light emitting diode (QLED) has reached 20% or above. Currently, a patterning process of quantum dots of the light emitting layer is a key step that decides a full-color high-resolution QLED device. At present, there have been transfer printing, ink-jet printing, photoetching and other ways for realizing the patterning process of the quantum dots.

However, there are problems in the prior art that quantum dots are prone to falling off in a patterning process (e.g., ultrasonic and developing) and formed patterns are irregular.

SUMMARY

The present disclosure provides a quantum dot device, a display apparatus, and a manufacturing method for a quantum dot device, to alleviate the problems in the prior art that quantum dots are prone to falling off in a patterning process and formed patterns are irregular.

An embodiment of the present disclosure provides a quantum dot device, including:
a substrate assembly:
a first fixing layer, where the first fixing layer is located on one side of the substrate assembly and has silane coupling agents with multi coordinate bonds, and a first connection structure is arranged between the first fixing layer and the substrate assembly; and
a quantum dot film layer, arranged on one side, facing away from the substrate assembly, of the first fixing layer; where the quantum dot film layer has a plurality of pattern portions, each of the plurality of pattern portions comprises quantum dots, and a second connection structure is arranged between the each pattern portion and the first fixing layer.

In a possible implementation, the first fixing layer further includes a third connection structure, and the different silane coupling agents with multi coordinate bonds are connected with one another through the third connection structure.

In a possible implementation, the first fixing layer contains a following structure:

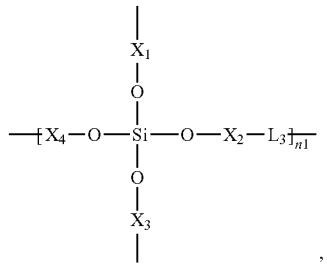

where the first connection structure is connected with X3, the second connection structure is connected with X1, L3 is the third connection structure,

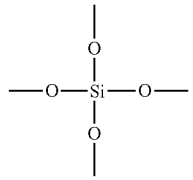

is the silane coupling agent with multi coordinate bonds, n1>1, X1 is an alkyl chain or a single bond, X2 is an alkyl chain or a single bond, X3 is an alkyl chain or a single bond, and X4 is an alkyl chain or a single bond.

In a possible implementation, the first connection structure is a single bond.

In a possible implementation, the first connection structure is formed by reaction between a first coordinating group connected with the silane coupling agent with multi coordinate bonds and a first group connected with the substrate assembly; and
the first coordinating group is a methyl group, an ethyl group or a propyl group; and the first group is hydroxy.

In a possible implementation, the second connection structure is formed by replacement of a second coordinating group connected with the silane coupling agent with multi coordinate bonds and a first ligand connected with the quantum dot; and
the substrate assembly includes a base substrate and a functional layer located on one side, facing the first fixing layer, of the base substrate; a material of the functional layer is zinc oxide; and the first group is a group connected to the functional layer.

In a possible implementation, the second coordinating group is one of:
amino:
polyamino:
hydroxy:
polyhydroxy:
mercapto:
polymercapto:
sulfide:
polysulfide;
phosphine; or
phosphine oxide.

In a possible implementation, the second coordinating group is the mercapto, the first ligand is oleic acid or oleylamine, and the second connection structure is —S—.

In a possible implementation, the third connection structure is a single bond.

In a possible implementation, the third connection structures are formed by reaction of two third coordinating groups, and the third coordinating groups are methyl, ethyl or propyl.

In a possible implementation, the quantum dot device further includes: a second fixing layer located on one side, facing away from the first fixing layer, of the quantum dot film layer:
where a fourth connection structure is arranged between the second fixing layer and the quantum dot film layer.

In a possible implementation, the second fixing layer includes a connection body, and the fourth connection structure is formed by replacement of a fourth coordinating group connected with the connection body and a second ligand connected with the quantum dot; and
the second fixing layer contains a following structure:

where the fourth connection structure is connected with R5, and n2>1.

In a possible implementation, the second fixing layer contains a following structure:

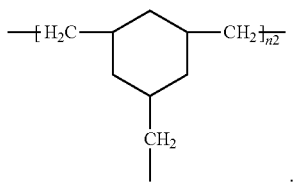

In a possible implementation, the second fixing layer includes a connection body, and the fourth connection structure is formed by replacement of a fourth coordinating group connected with the connection body and a second ligand connected with the quantum dot; and
the second fixing layer contains a following structure:

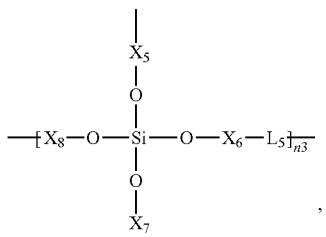

where the fourth connection structure is connected with X5, L5 is a fifth connection structure, n3>1, X5 is an alkyl chain or a single bond, X6 is an alkyl chain or a single bond, X7 is a methyl group, an ethyl group or a propyl group, and X8 is an alkyl chain or a single bond.

In a possible implementation, the fourth coordinating group is one of:

amino;
polyamino;
hydroxy;
polyhydroxy;
mercapto;
polymercapto;
sulfide;
polysulfide;
phosphine; or
phosphine oxide.

In a possible implementation, the fourth coordinating group is the mercapto, the second ligand is oleic acid or oleylamine, and the fourth connection structure is —S—.

An embodiment of the present disclosure further provides a display apparatus, including the quantum dot device provided by the embodiments of the present disclosure.

An embodiment of the present disclosure provides a manufacturing method for a quantum dot device, including:
providing a substrate assembly, where the substrate assembly contains a first group:
forming a patterned photoresist layer on one side of the substrate assembly, where the patterned photoresist layer exposes a target region of the substrate assembly where quantum dots are to be formed:
forming a first film layer on one side, facing away from the substrate assembly, of the photoresist layer; wherein the first film layer comprises a silane coupling agent with multi coordinate bonds and a first coordinating group and a second coordinating group connected with the silane coupling agent with multi coordinate bonds, to make the first coordinating group and the first group of the target region react to form a first connection structure:
forming a quantum dot thin film on one side, facing away from the photoresist layer, of the first film layer; where the quantum dot thin film comprises a quantum dot and a first ligand connected with the quantum dot, to make the second coordinating group and the first ligand react to form a second connection structure, and make the quantum dot thin film of the target region is connected with the substrate assembly through the first connection structure and the second connection structure; wherein the first film layer after reaction between the second coordinating group and the first ligand is used as a first fixing layer; and
removing the photoresist layer and the quantum dot thin film attached to the photoresist layer to form a quantum dot film layer including a plurality of pattern portions.

In a possible implementation, the quantum dot film layer further includes a second ligand connected with the quantum dot; and
after forming the quantum dot thin film on the side, facing away from the photoresist layer, of the first film layer and before removing the photoresist layer, the manufacturing method further includes:
forming a second film layer on one side, facing away from the first film layer, of the quantum dot thin film; where the second film layer comprises a connection body and a fourth coordinating group connected with the connection body, to make the fourth coordinating group and the second ligand have replacement reaction to form a fourth connection structure; where the second film layer after the replacement reaction between the fourth coordinating group and the second ligand is used as a second fixing layer.

In a possible implementation, the forming the first film layer on the side, facing away from the substrate assembly, of the photoresist layer includes:

preparing an ethanol solution of a mercapto-containing siloxane polymer, and adding a small amount of ammonium hydroxide to the ethanol solution to form first mixed liquor; where a structural formula of the siloxane polymer is

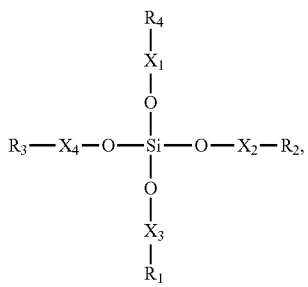

where R4 is mercapto, R2 is a methyl group, an ethyl group or a propyl group, R3 is a methyl group, an ethyl group or a propyl group, R1 is a methyl group, an ethyl group or a propyl group, X1 is an alkyl chain or a single bond, X2 is an alkyl chain or a single bond, X3 is an alkyl chain or a single bond, and X4 is an alkyl chain or a single bond:

taking the first mixed liquor to be dropwise dripped on the photoresist layer to form a mercapto-containing siloxane polymer thin film, and placing the thin film under a room temperature for a first duration; and rinsing with super-dry anhydrous ethanol in air for at least 2 times.

In a possible implementation, the forming the second film layer on the side, facing away from the first film layer, of the quantum dot thin film includes:

forming a thin film with a same material as the film layer on one side, facing away from the first film layer, of the quantum dot thin film, to have replacement reaction of oleic acid or an oleylamine ligand of the quantum dot and the mercapto, to form a layer of siloxane polymer thin film covering the quantum dot film layer.

In a possible implementation, the forming the second film layer on the side, facing away from the first film layer, of the quantum dot thin film includes:

forming a mercapto-containing organic polymer thin film on one side, facing away from the first film layer, of the quantum dot thin film, to have replacement reaction of oleic acid or an oleylamine ligand of the quantum dot and the mercapto, to form a layer of polymer thin film covering the quantum dot film layer, where a structural formula of the organic polymer thin film is

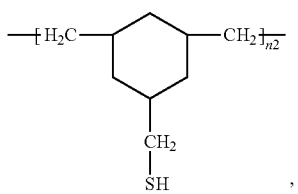

where n2>1.

The embodiments of the present disclosure have the following beneficial effects: in the embodiments of the present disclosure, the first fixing layer is arranged between the substrate assembly and the quantum dot film layer, the first connection structures are arranged between the first fixing layer and the substrate assembly, the second connection structures are arranged between the pattern portions of the quantum dot film layer and the first fixing layer, the first connection structures are formed by the reaction between the first coordinating groups connected with the silane coupling agents with multi coordinate bonds and the first groups connected with the substrate assembly, and the second connection structures are formed by replacement of the second coordinating groups connected with the silane coupling agents with multi coordinate bonds and the first ligands connected with the quantum dots. Therefore, the quantum dots of the pattern portions can be connected with the substrate assembly through the first fixing layer, and when the quantum dots are patterned, the problems in the prior art that the quantum dots are prone to falling off in the patterning process and formed patterns are irregular can be alleviated.

DETAILED DESCRIPTION OF THE EMBODIMENTS

Figure 1:
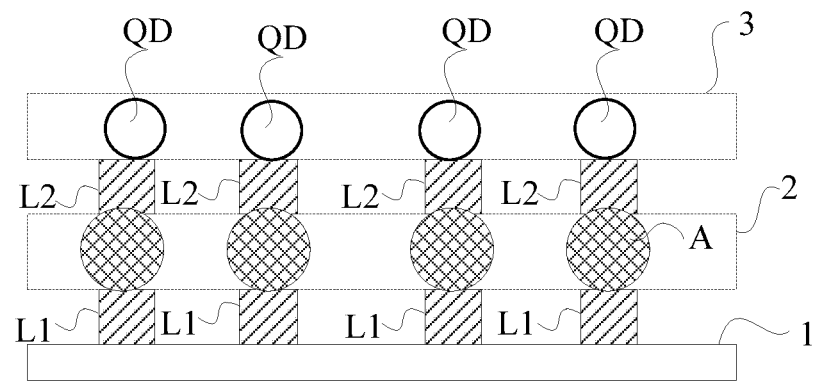
FIG. 1 is a first schematic structural diagram of a quantum dot device provided by an embodiment of the present disclosure.

In order to make the objectives, technical solutions and advantages of embodiments of the present disclosure clearer, the technical solutions of the embodiments of the present disclosure will be clearly and completely described below in conjunction with the accompanying drawings of the embodiments of the present disclosure. Apparently, the described embodiments are only a part of the embodiments of the present disclosure, not all of the embodiments. Based on the described embodiments of the present disclosure, all other embodiments obtained by those of ordinary skill in the art without creative work shall fall within the protection scope of the present disclosure.

Unless otherwise defined, technical or scientific terms used in the present disclosure shall have the ordinary meanings understood by those ordinarily skilled in the art to which the present disclosure pertains. The words "first", "second" and the like used in the present disclosure do not indicate any order, quantity or importance, but are only configured to distinguish different components. The words "comprise" or "include" or the like indicate that an element or item appearing before such words covers listed elements or items appearing after the words and equivalents thereof, and does not exclude other elements or items. The words "connect" or "couple" or the like are not limited to physical or mechanical connection, but may include electrical connection, whether direct or indirect. "Upper", "lower", "left", "right" and the like are only used to represent relative position relationships, and the relative position relationships may also change accordingly after an absolute position of a described object is changed.

In order to keep the following descriptions of the embodiments of the present disclosure clear and concise, detailed descriptions of known functions and known components are omitted.

From the perspective of actual industrial mass production, patterning of electron materials (quantum dots) is realized usually by a photoetching way. Photoetching requires photoresist. Photoresist is divided into positive photoresist and negative photoresist. However, the photoresist process has some problems during application: the cost of negative photoresist is low: but a developer usually uses p-xylene; and organic solvents containing benzene are toxic and are not conducive to environmental protection. Positive photoresist has good contrast, so generated graphics have a good resolution; and a developer is an alkaline aqueous solution, which is conducive to environmental protection. However, the alkaline solution may destroy quantum dots of a light emitting layer. Specifically, a "lift-off" process based on positive photoresist realizes the patterning of quantum dots; and the main steps are: "deposition of photoresist, mask exposure in a target region, developing, deposition of quantum dots, full exposure, developing and introduction of a patterned quantum dot layer in the target region". If a full-color (red, green, blue) QLED device is prepared, the above steps need to be repeated three times. The developing of photoresist mainly relies on an alkaline solution (such as ammonia spirit, or a tetramethylammonium hydroxide aqueous solution, etc.). Unfortunately, the alkaline solution may seriously damage the surface ligand state of quantum dots. Specifically, hydroxyl ions in the alkaline solution may destroy the coordination between surface ligands and nanocrystal dangling bonds, which may re-expose surface defect sites of the quantum dots, eventually damage a light emitting layer and reduce the efficiency of the device. Moreover, there are the problems that quantum dots are prone to falling off in a patterning process (e.g., ultrasonic and developing) and formed patterns are irregular.

In view of this, referring to FIG. 1, an embodiment of the present disclosure provides a quantum dot device, including:
a substrate assembly 1;
a first fixing layer 2, where the first fixing layer 2 is located on one side of the substrate assembly 1 and has silane coupling agents with multi coordinate bonds A; and first connection structures L1 are arranged between the first fixing layer 2 and the substrate assembly 1; specifically, the first connection structures L1 may be formed by reaction between first coordinating groups connected with the silane coupling agents with multi coordinate bonds A and first groups Z connected with the substrate assembly 1; that is, the first coordinating groups are groups connected with the silane coupling agents with multi coordinate bonds A before the first connection structures L1 are formed, the first groups Z are groups connected with the substrate assembly 1 before the first connection structures L1 are formed, and the first coordinating groups and the first groups Z react to form the first connection structures L1; and
a quantum dot film layer 3, located on one side, facing away from the substrate assembly 1, of the first fixing layer 2; where the quantum dot film layer 3 includes a plurality of pattern portions (FIG. 1 only shows one of the pattern portions, and during specific implementation, there may be a plurality of pattern portions, which is not limited in the present disclosure), and each pattern portion has quantum dots QD; and second connection structures L2 are arranged between the pattern portion and the first fixing layer 2. Specifically, the second connection structures L2 may be formed by replacement of second coordinating groups connected with the silane coupling agents with multi coordinate bonds A and first ligands connected with the quantum dots QD. That is, the second coordinating groups are groups connected with the silane coupling agents with multi coordinate bonds A before the second connection structures L2 are formed, the first ligands are groups connected with the quantum dots QD before the second connection structures L2 are formed, and the second coordinating groups and the first ligands react to form the second connection structures L2.

In the embodiment of the present disclosure, the first fixing layer is arranged between the substrate assembly and the quantum dot film layer, the first connection structures L1 are arranged between the first fixing layer and the substrate assembly, the second connection structures L2 are arranged between the pattern portion of the quantum dot film layer and the first fixing layer 2, the first connection structures L1 are formed by the reaction between the first coordinating groups R1 connected with the silane coupling agents with multi coordinate bonds A and the first groups Z connected with the substrate assembly 1, and the second connection structures L2 are formed by replacement of the second coordinating groups R2 connected with the silane coupling agents with multi coordinate bonds A and the first ligands Y1 connected with the quantum dots QD. Therefore, the quantum dots QD of the pattern portions can be connected with the substrate assembly 1 through the first fixing layer, and when the quantum dots are patterned, the problem in the prior art that the quantum dots are prone to falling off in the patterning process and formed patterns are irregular can be alleviated.

Figure 2:
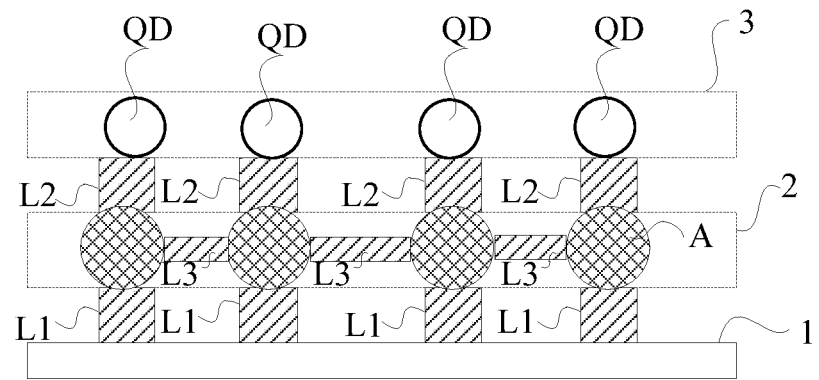
FIG. 2 is a second schematic structural diagram of a quantum dot device provided by an embodiment of the present disclosure.

During specific implementation, referring to FIG. 2, the first fixing layer 2 further includes third connection structures L3, and the different silane coupling agents with multi coordinate bonds A are connected with one another through the third connection structures L3. Specifically, each third connection structure L3 is formed by reaction of two third coordinating groups which are connected to the different silane coupling agents with multi coordinate bonds A respectively. That is, before the third connection structures L3 are formed, the silane coupling agents with multi coordinate bonds A are further connected with the third coordinating groups, and the two third coordinating groups of every two adjacent silane coupling agents with multi coordinate bonds A react to form the third connection structures L3.

It should be noted that the first fixing layer may achieve three functions: (1) connecting with a lower film layer; (2) connecting with quantum dots; and (3) cross-linking by itself to form a tight molecular layer to avoid prone falling in a process. A silane coupling agent containing the silane coupling agent with multi coordinate bonds A may complete this step with low cost and easy operation; and an existing substrate assembly (such as a substrate assembly containing ZnO or ZnMgO) itself contains —OH capable of connecting with the silane coupling agent, so the silane coupling agent is a preferred choice.

During specific implementation, the quantum dot device further includes: a second fixing layer 4 located on one side, facing away from the first fixing layer 2, of the quantum dot film layer 3; where the second fixing layer 4 includes connection bodies B; fourth connection structures L4 are arranged between the second fixing layer 4 and the quantum dot film layer 3; and the fourth connection structures L4 are formed by replacement of fourth coordinating groups connected with the connection bodies B and second ligands connected with the quantum dots QD. That is, the fourth coordinating groups are groups connected with the connection bodies B before the fourth connection structures L4 are formed, the second ligands are groups connected with the quantum dots QD before the fourth connection structures L4 are formed, and the fourth coordinating groups and the second ligands react to form the fourth connection structures L4.

In the embodiment of the present disclosure, the second fixing layer 4 is further formed on the side, facing away from the first fixing layer 2, of the quantum dot film layer 3; and the fourth connection structures L4 are arranged between the second fixing layer 4 and the quantum dot film layer 3, so that the fixing layers protect upper and lower layers of the patterned quantum dots, which can greatly lower the risk of falling off of the quantum dots and is conductive to forming a tight quantum dot thin film. Moreover, the second fixing layer 4 is arranged on the side, facing away from the first fixing layer 2, of the quantum dot film layer 3, so as to avoid damage of the alkaline solution to the surface ligand state of the quantum dots in the patterning process, and avoid damage of the hydroxyl ions in the alkaline solution to the coordination effect of the surface ligands of the quantum dots and the nanocrystal dangling bonds, thereby avoiding exposure of the surface defect sites of the quantum dots, avoiding damage of the light emitting layer, and greatly lowering the impact of leak currents on device performance, and thus the life and efficiency of the quantum dot device can be greatly prolonged and improved. The second fixing layer only needs to connect and cover the quantum dots to prevent falling off of the quantum dots in a following process, and in terms of function, it has less requirements than the first fixing layer, and the types of materials that can be selected are more than the first fixing layer.

During specific implementation, the substrate assembly 1 may have the first groups Z before the first functional layer is formed, and the first groups Z may be, for example, hydroxy. Specifically, the substrate assembly 1 may be a base substrate or a composite structure including the base substrate and a functional film layer located on one side of the base substrate. Specifically, the substrate assembly 1 may be processed to make the substrate assembly 1 have the first groups Z, or, a functional film layer having the first groups Z may be formed on the base substrate to make the whole substrate assembly 1 have the first groups Z. For example, a functional layer which has a material of zinc oxide is formed on the base substrate, so the substrate assembly 1 may have the first groups Z.

During specific implementation, before the first connection structures L1 are formed by the first fixing layer 2 and the substrate assembly 1, the first fixing layer 2 contain a following structure:

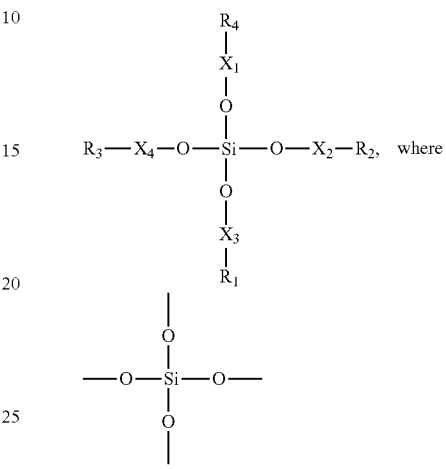

is a silane coupling agent with multi coordinate bonds A, R1 is a first coordinating group and may react with the first group of the substrate assembly 1, specifically. For example, R1 may be a methyl group, an ethyl group or a propyl group, and correspondingly, the first group of the substrate assembly 1 may be hydroxy. R4 is a second coordinating group and may be a group connected with the quantum dot QD, for example, the second coordinating group may be amino, polyamino, hydroxy, polyhydroxy, mercapto, polymercapto, sulfide, polysulfide, phosphine or phosphine oxide. R2 and R3 may be both third coordinating groups which may be groups connecting two adjacent silane coupling agents with multi coordinate bonds A. Specifically, R2 may be a first sub coordinating group and may specifically be a methyl group, an ethyl group or a propyl group; and R3 may be a second sub coordinating group and may specifically be a methyl group, an ethyl group or a propyl group. Specifically, a first connection group X1 may be further connected between the silane coupling agent with multi coordinate bonds A and the second coordinating group R4, and X1 may specifically be an alkyl chain or a single bond. Specifically, a second connection group X2 may be further connected between the silane coupling agent with multi coordinate bonds A and the first sub coordinating group R2, and X2 may specifically be an alkyl chain or a single bond. Specifically, a third connection group X3 may be further connected between the silane coupling agent with multi coordinate bonds A and the first coordinating group R1, and X3 may specifically be an alkyl chain or a single bond. Specifically, a fourth connection group X4 may be further connected between the silane coupling agent with multi coordinate bonds A and the second sub coordinating group R3, and X4 may specifically be an alkyl chain or a single bond.

Specifically, the first connection group X1 is a single bond, the second connection group X2 is a single bond, the third connection group X3 is a single bond, the fourth connection group X4 is a single bond, and the third connection structure L3 is a single bond. After the first connection structures L1 are formed by the first fixing layer 2 and the substrate assembly 1, the first fixing layer 2 contains a following structure:

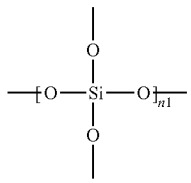

When the first fixing layer 2 is formed on the substrate assembly 1, and the quantum dot film layer 3 is formed on the side, facing away from the substrate assembly 1, of the first fixing layer 2, the first coordinating groups R1 in the first fixing layer 2 may react with the first groups on the surface of the substrate assembly 1 to form the first connection structures L1, and the second coordinating groups R4 in the first fixing layer 2 and the quantum dots QD may be combined to form the second connection structures L2, so that the quantum dots QD are connected with the substrate assembly 1.

Correspondingly, after the reaction, the first fixing layer 2 contains a following structure:

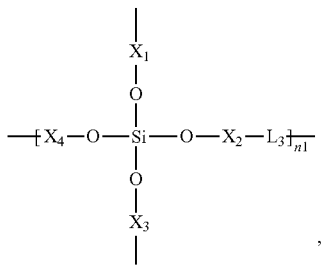

where the first connection structure L1 is connected with X3, the second connection structure L2 is connected with X1, L3 is a third connection structure,

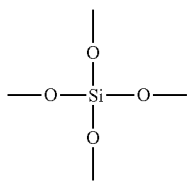

is a silane coupling agent with multi coordinate bonds, $n1>1$, X1 is an alkyl chain or a single bond, X2 is an alkyl chain or a single bond, X3 is an alkyl chain or a single bond, and X4 is an alkyl chain or a single bond. Specifically, when the first coordinating group is a methyl group, an ethyl group or a propyl group, and the first group is hydroxy, the first connection structures L1 is a single bond. Specifically, when the second coordinating group is mercapto and the first ligand is oleic acid or oleylamine, the second connection structure L2 is —S—. Specifically, when the third coordinating group is a methyl group, an ethyl group or a propyl group, the third connection structure L3 is a single bond.

Specifically, before the fourth connection structures are formed between the second fixing layer 4 and the quantum dot film layer 3, materials for forming the second fixing layer 4 and the first fixing layer 2 may be the same, such as a silane coupling agent, where the fourth coordinating group may be amino, polyamino, hydroxy, polyhydroxy, mercapto, polymercapto, sulfide, polysulfide, phosphine or phosphine oxide. Specifically, materials for forming the second fixing layer 4 and the first fixing layer 2 may be different, for example, before the reaction with the quantum dot film layer 3, the second fixing layer 4 is a polymer containing a quantum dot coordinating end and may include a following structural formula:

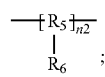

where $n2>1$. R6 is a fourth coordinating group, and may be, for example, amino, polyamino, hydroxy, polyhydroxy, mercapto, polymercapto, sulfide, polysulfide, phosphine or phosphine oxide and is used for combination with the quantum dot QD. R5 is a structure formed by polymerization of acrylic acid, methyl acrylate, ethyl acrylate, butyl acrylate, isobutyl methacrylate, 2-ethylhexyl acrylate, isooctyl acrylate, lauryl acrylate, benzyl acrylate, cyclohexyl acrylate, perfluoroalkyl acrylate, hydroxyethyl methacrylate phosphate, isobomeol acrylate, (tetrahydrofuran-2-yl) methyl acrylate, amino acid, ethylene or acetylene monomers. Specifically, before the reaction with the quantum dot film layer 3, the structural formula of the second fixing layer 4 may be:

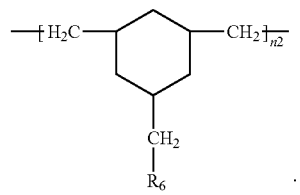

Correspondingly, materials for forming the second fixing layer 4 and the first fixing layer 2 may be the same, and after the reaction, the second fixing layer 4 contains a following structure:

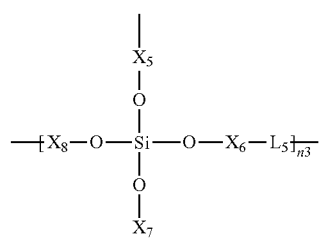

where the fourth connection structure L4 is connected with X5, L5 is a fifth connection structure, $n3>1$, X5 is an alkyl chain or a single bond, X6 is an alkyl chain or a single bond, X7 is a methyl group, an ethyl group or a propyl group, and X8 is an alkyl chain or a single bond. If the second fixing layer 4 is the polymer containing the quantum dot coordinating end, after the reaction, the second fixing layer 4 contains a following structure:

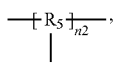

where the fourth connection structure L4 is connected with R5, and n2>1. Specifically, after the reaction, the structure contained in the second fixing layer may be:

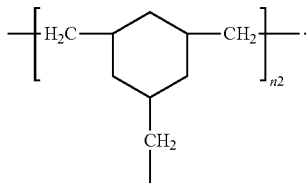

Figure 4:
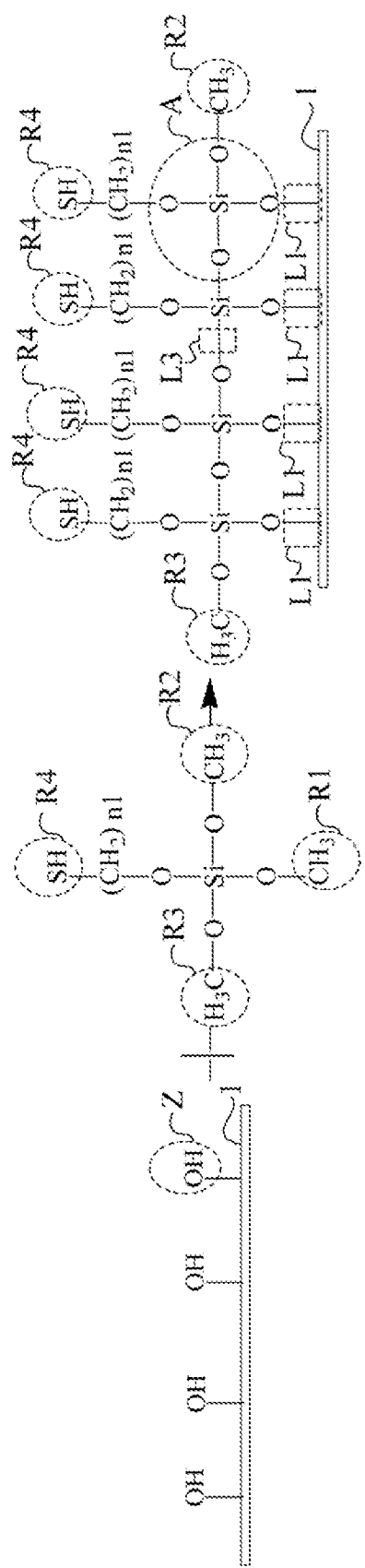
FIG. 4 is a schematic diagram of a reaction process of a first fixing layer and a substrate assembly provided by an embodiment of the present disclosure.

Specifically, in the following, in combination with FIG. 4 and FIG. 5, a forming process of the first connection structures L1, the second connection structures L2 and the third connection structures L3 provided by the embodiments of the present disclosure is further described as follows by taking an example that the first coordinating group R1 is a methyl group, the second coordinating group R2 is mercapto, the first sub coordinating group R2 is methyl, the second sub coordinating group R3 is a methyl group, the first connection group X1 is

Figure 3:
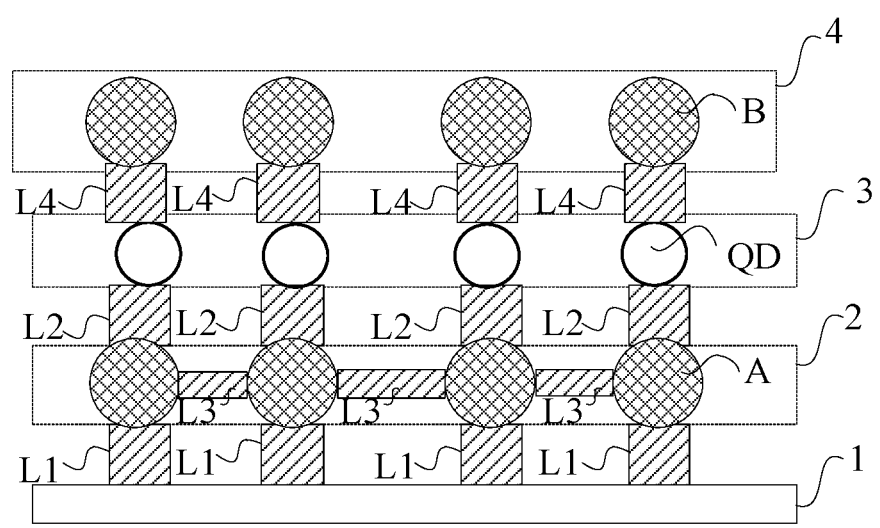
FIG. 3 is a third schematic structural diagram of a quantum dot device provided by an embodiment of the present disclosure.
Figure 5:
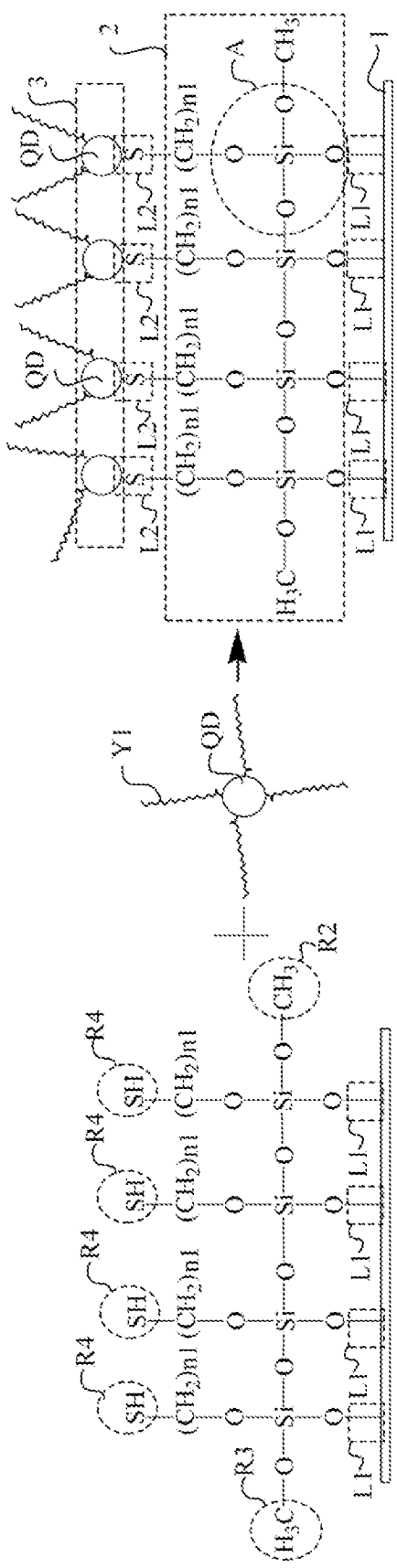
FIG. 5 is a schematic diagram of a reaction process of a first fixing layer and a quantum dot film layer provided by an embodiment of the present disclosure.

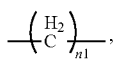

the second connection group X2 is a single bond, the third connection group X3 is a single bond, the fourth connection group X4 is a single bond, the first group Z is hydroxy, and the first ligand Y1 is oleic acid:

before the first connection structures L1 are formed, the surface of the substrate assembly 1 has the first groups Z, and the first groups Z are —OH; the first coordinating groups —CH3 of the first fixing layer 2 and the first groups Z —OH react as shown in FIG. 3 to form the first connection structures L1, and moreover, the third coordinating groups (R2 or R3) of every two adjacent silane coupling agents with multi coordinate bonds A react to form the third connection structures L3; and after the quantum dot film layer is formed, the second coordinating groups —SH of the first fixing layer 2 and the first ligands Y1 have a replacement reaction as shown in FIG. 5 to form the second connection structures L2.

Figure 6:
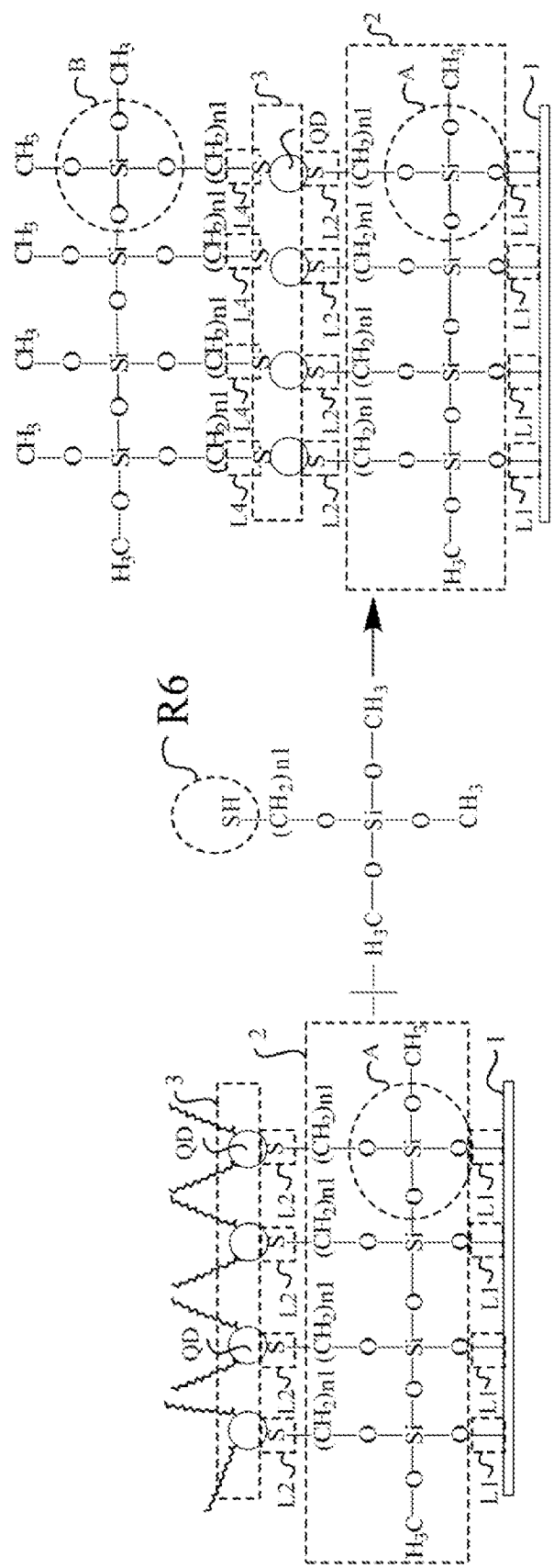
FIG. 6 is a schematic diagram of a reaction process of a second fixing layer and a quantum dot film layer provided by an embodiment of the present disclosure.

Specifically, in the following, in combination with FIG. 6, a forming process of the fourth connection structures L4 provided by the embodiments of the present disclosure is further described as follows by taking an example that the material of the second fixing layer 4 is the silane coupling agent, the fourth coordinating group R6 is mercapto and the second ligand is oleic acid:

before the fourth connection structures L4 are formed, the surfaces of the quantum dots QD further contain the second ligands (the second ligands specifically may be the same as the first ligands as the oleic acid, the second ligands may be specifically first ligands that have not been completely combined with the second coordinating groups R4, or, the second ligands and the first ligands may also be connected to different quantum dots), and mercapto of the fourth coordinating groups and oleic acid of the second ligands have replacement reaction to form the fourth connection structures L4.

Figure 7:
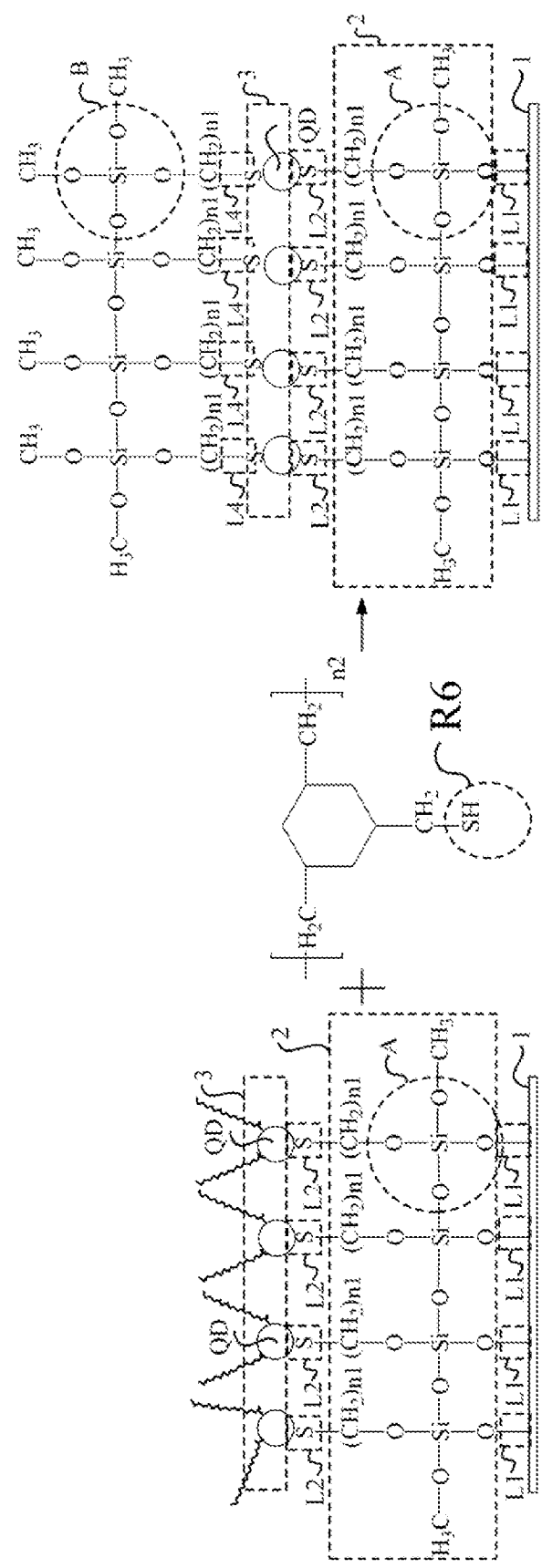
FIG. 7 is a schematic diagram of another reaction process of a second fixing layer and a quantum dot film layer provided by an embodiment of the present disclosure.

Specifically, in the following, in combination with FIG. 7, a forming process of the fourth connection structures L4 provided by the embodiments of the present disclosure is further described as follows by taking an example that the material of the second fixing layer 4 is the polymer containing the quantum dot coordinating end

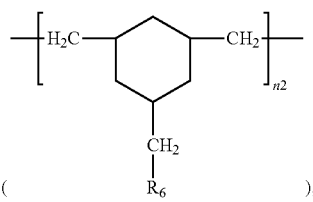

the fourth coordinating group R6 is mercapto and the second ligand is oleic acid:

before the fourth connection structures L4 are formed, the surfaces of the quantum dots QD further contain the second ligands, and mercapto of the fourth coordinating groups R6 and oleic acid of the second ligands have replacement reaction to form the fourth connection structures L4, —S—.

Based on the same inventive concept, an embodiment of the present disclosure further provides a display apparatus, including the quantum dot device provided by the embodiments of the present disclosure.

Figure 8:
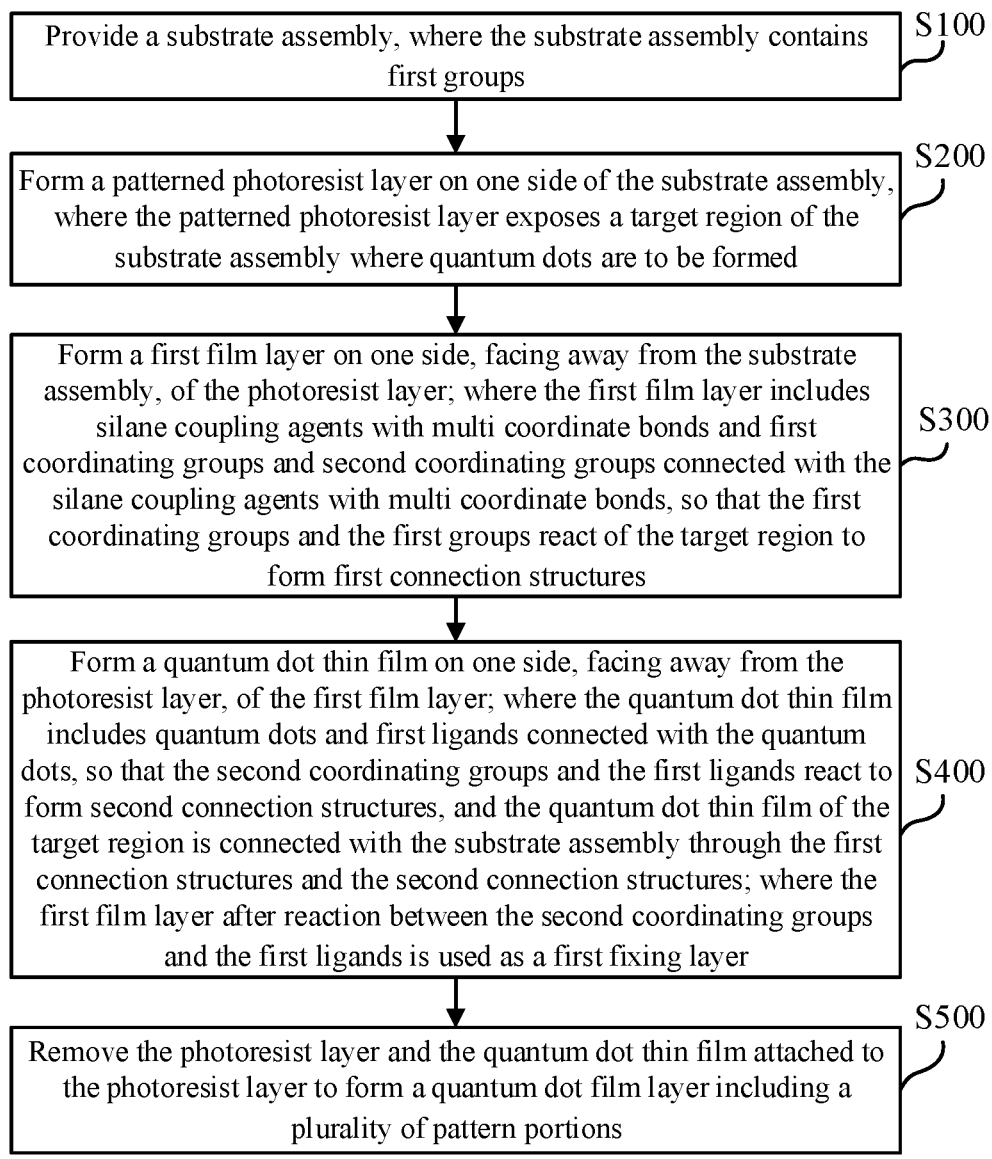
FIG. 8 is a schematic diagram of a manufacturing flow of a quantum dot device provided by an embodiment of the present disclosure.

Based on the same inventive concept, an embodiment of the present disclosure further provides a manufacturing method for a quantum dot device, as shown in FIG. 8, including the following.

Step S100, a substrate assembly is provided, where the substrate assembly contains first groups.

Step S200, a patterned photoresist layer is formed on one side of the substrate assembly, where the patterned photoresist layer exposes a target region of the substrate assembly where quantum dots are to be formed.

Step S300, a first film layer is formed on one side, facing away from the substrate assembly, of the photoresist layer; where the first film layer includes silane coupling agents with multi coordinate bonds, and first coordinating groups and second coordinating groups connected with the silane coupling agents with multi coordinate bonds, so that the first coordinating groups and the first groups of the target region react to form first connection structures.

Specifically, in a possible implementation, an operation of forming the first film layer on the side, facing away from the substrate assembly, of the photoresist layer may include the following: an ethanol solution of a mercapto-containing siloxane polymer is prepared, and a small amount of ammonium hydroxide is added to the ethanol solution to form first mixed liquor; where a structural formula of the siloxane polymer is

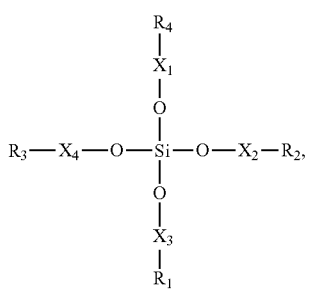

where R4 is mercapto, R2 is a methyl group, an ethyl group or a propyl group, R3 is a methyl group, an ethyl group or a propyl group, R1 is a methyl group, an ethyl group or a propyl group, X1 is an alkyl chain or a single bond, X2 is an alkyl chain or a single bond, X3 is an alkyl chain or a single bond, and X4 is an alkyl chain or a single bond. It should be noted that, in a silane coupling agent, in terms of connection of oxygen with R1, R2 and R3, if R1, R2 and R3 are methyl groups, methoxy is formed; if R1, R2 and R3 are ethyl groups, ethoxy is formed; and methoxy makes coupling reaction of the silane coupling agent operable under a normal temperature, but ethoxy makes it more difficult (e.g., heating is required). If X1 being the alkyl chain, X2 being the alkyl chain, X3 being the alkyl chain and X4 being the alkyl chain are included, the silane coupling agent may have more carbon atoms; and the more carbon, the more harsh the reaction condition, the higher the manufacturing cost and the more difficult the manufacturing process. The first mixed liquor is taken to be dropwise dripped on the photoresist layer to form a mercapto-containing siloxane polymer thin film, and the thin film is placed under a room temperature for a first duration; and the thin film is rinsed with super-dry anhydrous ethanol in air for at least 2 times.

Step S400, a quantum dot thin film is formed on one side, facing away from the photoresist layer, of the first film layer; where the quantum dot thin film includes quantum dots and first ligands connected with the quantum dots, so that the second coordinating groups and the first ligands react to form second connection structures, and the quantum dot thin film of the target region is connected with the substrate assembly through the first connection structures and the second connection structures; where the first film layer after reaction between the second coordinating groups and the first ligands is used as a first fixing layer.

Step S500, the photoresist layer is removed and the quantum dot thin film attached to the photoresist layer is removed, to form a quantum dot film layer including a plurality of pattern portions.

Figure 9:
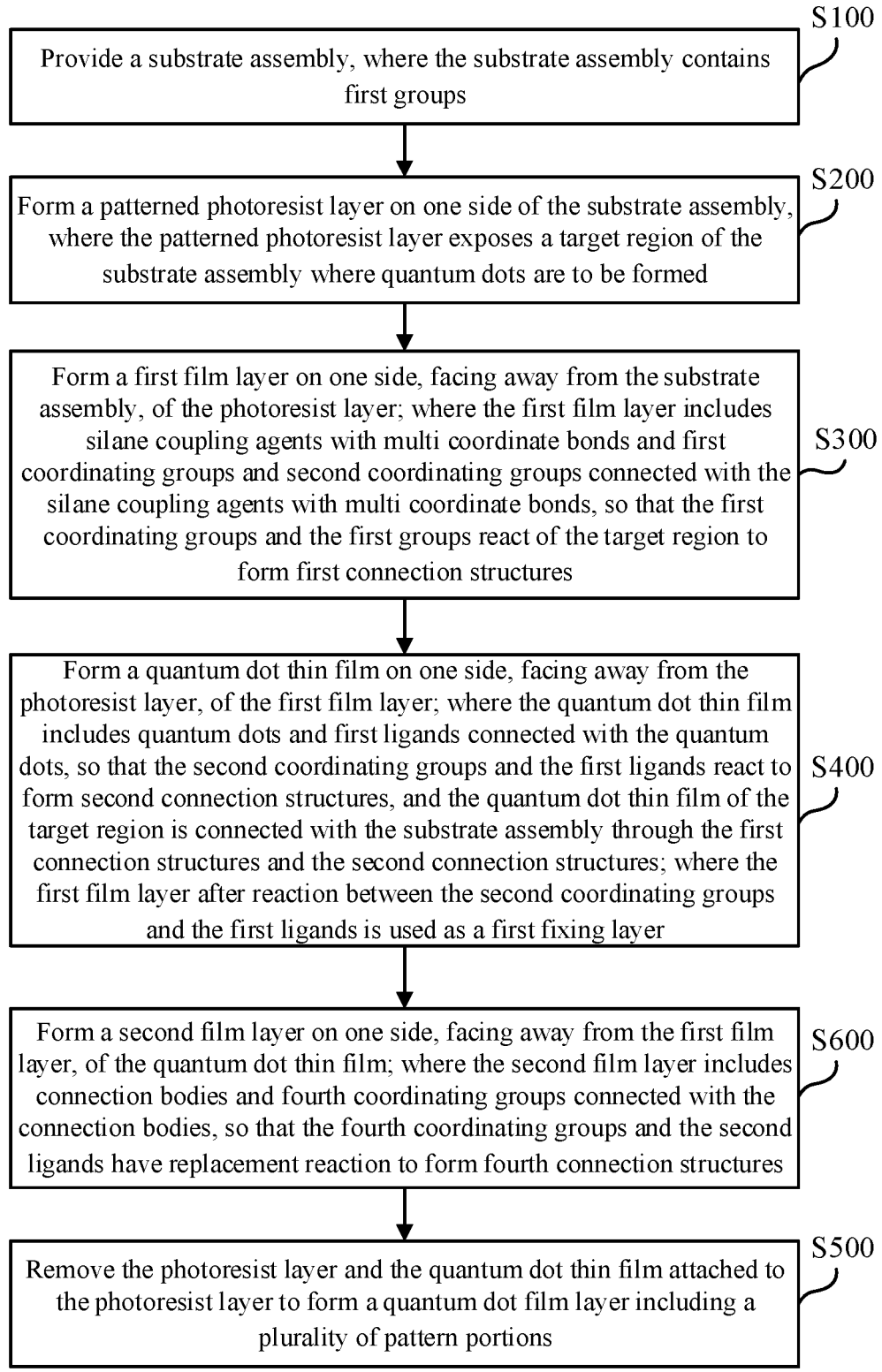
FIG. 9 is a schematic diagram of another manufacturing flow of a quantum dot device provided by an embodiment of the present disclosure.
Figure 10:
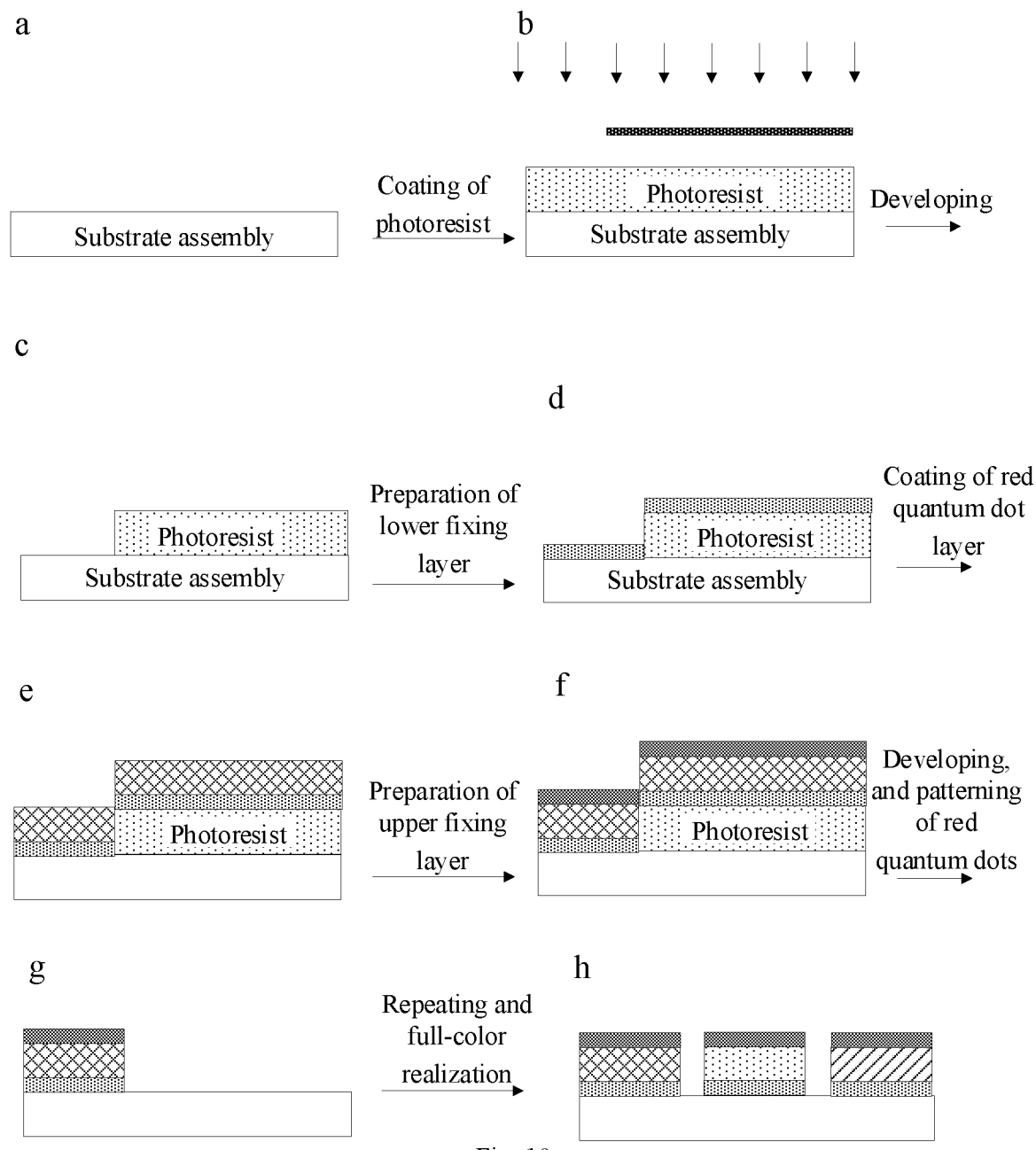
FIG. 10 is a schematic diagram of another specific manufacturing flow of a quantum dot device provided by an embodiment of the present disclosure.

During specific implementation, referring to FIG. 9, the quantum dot film layer further includes second ligands connected with the quantum dots. After step S400 and before step S500, that is, after the quantum dot thin film is formed on one side, facing away from the photoresist layer, of the first film layer and before the photoresist layer is removed, the manufacturing method further includes:

step S600, forming a second film layer on one side, facing away from the first film layer, of the quantum dot thin film; where the second film layer includes connection bodies and fourth coordinating groups connected with the connection bodies, so that the fourth coordinating groups and the second ligands have replacement reaction to form fourth connection structures; where the second film layer after the replacement reaction between the fourth coordinating groups and the second ligands is used as a second fixing layer.

During specific implementation, materials for forming the second film layer and the first film layer may be the same, and correspondingly, an operation of forming the second film layer on the side, facing away from the first fixing layer, of the quantum dot thin film in step S600 may include:

forming a thin film with the same material as the first film layer on one side, facing away from the first film layer, of the quantum dot thin film, to have replacement reaction of oleic acid or oleylamine ligands of the quantum dots and the mercapto, so as to form a layer of siloxane polymer thin film covering the quantum dot film layer.

During specific implementation, materials for forming the second film layer and the first film layer may also be different, and correspondingly, an operation of forming the second film layer on the side, facing away from the first fixing layer, of the quantum dot thin film in step S600 includes:

forming a mercapto-containing organic polymer thin film on one side, facing away from the first film layer, of the quantum dot thin film, to have replacement reaction of oleic acid or oleylamine ligands of the quantum dots and the mercapto, so as to form a layer of polymer thin film covering the quantum dot film layer. A structural formula of the organic polymer thin film is

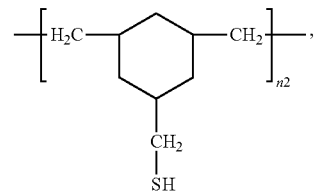

where n2>1.

In order to understand the manufacturing method of the quantum dot device provided by the embodiments of the present disclosure more clearly, the method is further exemplified below.

For example, in combination with FIG. 4, FIG. 5, FIG. 6 and FIG. 10, in a possible embodiment, a material for forming the first film layer is a mercapto-containing siloxane polymer, a material for forming the second film layer is a mercapto-containing siloxane polymer, and specific manufacturing steps may be the following.

(1) Cleaning. Conductive glass (may specifically include a base substrate and a conductive film layer (indium tin oxide or a fluorine-doped SnO2 conductive thin film (SnO2: F, FTO)) formed on the base substrate, and the conductive film layer may serve as a cathode of the quantum dot device) is cleaned through water, isopropanol and ultrasonic respectively, and subjected to ultraviolet UV treatment for 5-10 min.

(2) Introduction of an electron transfer layer. The electron transfer layer may be a zinc oxide nanoparticle thin film or a zinc oxide thin film, and the base substrate formed with the electron transfer layer and the conductive film layer may serve as the substrate assembly 1 in its entirety, with the surface containing hydroxy. A step of forming the electron transfer layer may specifically include the following.

(a) Preparation of a zinc oxide nanoparticle thin film. For example, spin-coating with zinc oxide nanoparticles is performed, and then heating is performed under 80° C. to 120°

C. to form a film. A material of the electron transfer layer may further be ion-doped zinc oxide nanoparticles, such as Mg-doped, In-doped, Al-doped and Ga-doped magnesium oxide nanoparticles. A rotating speed of a spin coater is set to be 500 rpm to 2500 rpm to adjust a thickness of the film layer.

(b) Preparation of a zinc oxide thin film. 1 g of zinc acetate (or zinc nitrate) is dissolved in 5 mL of a mixed solution of ethanol amine and n-butanol. The conductive glass is placed in the spin coater, 90 μL to 120 μL of a zinc precursor solution is dropwise added onto the conductive glass, and spin-coating is performed. The conductive glass is placed on a heating stage of 250 degrees to 300 degrees, and heated to volatilize a solvent; and a polyetherimide film layer is introduced onto the conductive glass.

(3) Photoresist coating, exposure and developing. Spin-coating of photoresist is performed, and red pixels are exposed and developed to expose the red pixels.

(4) Introduction of a mercapto-containing siloxane polymer thin film (the lower fixing layer, i.e., the first fixing layer 2). Specific manufacturing steps may be the following: an ethanol solution (0.5 mL of 3-mercaptopropyl trimethoxysilane and 4.5 mL of ethanol) of 3-mercaptopropyl trimethoxysilane

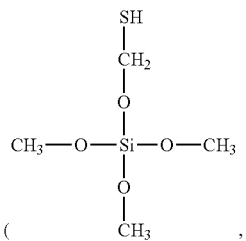

where R4 is mercapto, R2 is a methyl group, R3 is a methyl group, R1 is a methyl group, X1 is a single bond, X2 is a single bond, X3 is a single bond and X4 is a single bond) is prepared, a small amount of ammonium hydroxide (0.1 mL) is added into the ethanol solution, 90 μL of the above solution is dropwise dripped on the conductive glass (substrate assembly) and subjected to spin-coating to form a film, with a rotating speed of 1000-4000 rpm, and the film is placed under the room temperature for 1-2 h. The conductive glass is rinsed with super-dry anhydrous ethanol for 2-3 times. Completing the step in air may get rid of the reliance on an expensive glove box, and the concentration and spin-coating rotating speed of a silane solution are controlled to form a layer of tight silane-coupled silicon oxide thin film on an upper film layer. In addition, a mercapto silane agent in this step may be selected from: 3-mercaptopropyl trimethoxysilane, 3-mercaptopropyl triethoxysilane, 3-mercaptopropyl methyl dimethoxysilane, 3-mercaptopropyl methyl diethyloxysilane, mercaptopropyl silane, 3-mercaptopropyl trimethylsilane, bis-[3-(triethoxysilicon)propyl]-tetrasulfide and other mercapto-containing silane agents.

(5) Spin-coating of a red quantum dot layer. Specific manufacturing steps may be the following.

(a) Preparation of a CdSe kernel: 0.4 mmol of CdO, 3.2 mmol of oleic acid (OA) and 10 mL of 1-octadecylene (ODE) are added into a 50 mL three-necked round-bottom flask, heating is performed at 120° C., vacuumizing is performed for 1 h, nitrogen is introduced, the temperature is raised to 240° C., and a solution in the three-necked flask is in a clear and transparent state. 1 g of tri-n-octylphosphine (TOP) and 3 g of cetylamine are added, the temperature is lowered to 150° C., vacuumizing is performed for 30 min, nitrogen is introduced, and the temperature is raised to 280° C. A TOP-Se settled solution (2 mmol of Se, 2 mL of TOP and 2.5 mL of ODE are stirred in a glove box to form yellow transparent liquid) is rapidly injected, the temperature is preserved for 3 min and then rapidly lowered to the room temperature, multiple times of extraction is performed with a methanol/chloroform solution with a volume ratio of 3:1, and quantum dots are dispersed in chloroform for standby application.

(b) Preparation of a ZnS shell layer precursor: 0.3 mmoL of $Zn(Ac)_2$, 1 mmol of dodecylic acid (DDT), 6 mL of 1-octadecylene (ODE) and 4 mL of oleylamine (OLA) are added into a three-necked round-bottom flask, and after three times of heating while stirring at 90° C., vacuumizing and nitrogen introduction, a product is for standby application.

(c) A shell layer cladding process: 2 mL of a CdSe chloroform solution, 2 mL of ODE and 200 μL of OA are added into the three-necked round-bottom flask; after three times of vacuumizing at 120° C. and nitrogen replacement, the temperature is raised to 240° C., and the ZnS shell layer precursor is transferred to a main reaction system at a speed of 1.5 mL/h.

(d) A cleaning process: in order to thoroughly remove free ligands, the cleaning process has three steps: (1) 100 mL of an acetone/methanol mixed solution with a volume ratio of 7:3 is added into a three-necked round-bottom flask containing a quantum dot solution, and after magnetic stirring at 60° C. for 10 min, sediment is obtained through centrifuging; (2) in the three-necked round-bottom flask, the sediment is completely dispersed in 20 mL of toluene, then 100 mL of an acetone/methanol mixed solution with a volume ratio of 3:7 is added, and after magnetic stirring at 60° C. for 10 min, sediment is obtained through centrifuging; and (3) the sediment is completely dispersed in 20 mL of toluene and added into the three-necked round-bottom flask, 20 mL of glacial acetic acid and 70 mL of methanol are added, after stirring at 70° C. for 10 min, sediment is obtained through centrifuging, the sediment is placed in a vacuum drying box to be dried at 60° C., and a 15 mg/ml n-octane solution is prepared for standby application.

(e) Spin-coating of a quantum dot layer: original ligands of quantum dots are oleic acid or oleylamine; and since mercapto of the substrate subjected to 3-mercaptopropyl trimethoxysilane is exposed at the outermost end, and may be combined with the quantum dots, the quantum dots are fixed to the substrate.

(6) Introduction of a mercapto-containing siloxane polymer thin film (the upper fixing layer, i.e., the second fixing layer 4) again. Specific manufacturing steps may be the following: due to developing, ultrasonic and other processes in follow-up processes of multi-layer quantum dots, the quantum dots are prone to falling off, modification with 3-mercaptopropyl trimethoxysilane is performed on the top of the quantum dots again, and then a layer of siloxane polymer thin film is formed to cover the quantum dots through the coordination of mercapto with the quantum dots, so that the quantum dots are free from the impact of the developing and ultrasonic processes.

(7) Peeling off of photoresist. The photoresist is peeled off to form patterned red quantum dots.

(8) Introduction of a hole transfer layer. The hole transfer layer is formed on the conductive glass through spin-coating or evaporation or the like. An organic substance as a hole transfer layer may be selected from TFB (poly(9,9-dioctyl fluorene-co-N-(4-butylphenyl)diphenylamine)), or PVK (polyvinyl carbazole) or other commercial hole transfer compounds. A film-forming condition of TFB is: film forming in inert gas of 130° C. to 150° C. The thickness of the film layer may be regulated according to the rotating speed of the spin coater, and the evaporated hole transfer material may also be used in this step.

(9) Introduction of a hole injection layer. The hole injection layer is formed on the conductive glass through spin-coating or evaporation or the like. An organic substance as the hole injection layer may be selected from PEDOT:PSS 4083 (poly3,4-ethylene dioxythiophene/polystyrene sulfonate) or other commercial compounds suitable for the hole injection layer. A film-forming temperature of PEDOT is 130° C. to 150° C. in air. The thickness of the film layer may be regulated according to the rotating speed of the spin coater, and the evaporated hole injection material may also be used in this step.

(10) Introduction of an anode. Finally, an anode material is introduced, for example, an aluminum film or a silver film is evaporated, or an indium zinc oxide (IZO) film is sputtered to prepare a QLED device.

(11) Packaging. A packaging cover plate is adopted for covering, the device is packaged through ultraviolet curing glue, and thus a QLED is prepared.

(12) Preparation of a full-color QLED. The above steps are repeated to form patterned green and blue pixels so as to form the full-color OLED, and additionally, the patterning order of red quantum dots, green quantum dots and blue quantum dots may also be adjusted as needed.

For another example, in a possible embodiment, in combination with FIG. 4, FIG. 5, FIG. 7 and FIG. 10, a material for forming the first film layer is a mercapto-containing siloxane polymer, a material for forming the second film layer is a mercapto-containing organic polymer thin film, and specific manufacturing steps may be the following.

(1) Cleaning. Conductive glass (may specifically include a base substrate and a conductive film layer (indium tin oxide or a fluorine-doped SnO2 conductive thin film (SnO2: F, FTO)) formed on the base substrate, and the conductive film layer may serve as a cathode of the quantum dot device) is cleaned through water, isopropanol and ultrasonic respectively, and subjected to ultraviolet UV treatment for 5-10 min.

(2) Introduction of an electron transfer layer. The electron transfer layer may be a zinc oxide nanoparticle thin film or a zinc oxide thin film, and the base substrate formed with the electron transfer layer and the conductive film layer may serve as the substrate assembly 1 in its entirety, with the surface containing hydroxy. A step of forming the electron transfer layer may specifically include the following.

(a) Preparation of a zinc oxide nanoparticle thin film. For example, spin-coating with zinc oxide nanoparticles is performed, and then heating is performed under 80° C. to 120° C. to form a film. A material of the electron transfer layer may further be ion-doped zinc oxide nanoparticles, such as Mg-doped, In-doped, Al-doped and Ga-doped magnesium oxide nanoparticles. A rotating speed of a spin coater is set to be 500 rpm to 2500 rpm to adjust a thickness of the film layer.

(b) Preparation of a zinc oxide thin film. 1 g of zinc acetate (or zinc nitrate) is dissolved in 5 mL of a mixed solution of ethanol amine and n-butanol. The conductive glass is placed in the spin coater, 90 μL to 120 μL of a zinc precursor solution is dropwise added onto the conductive glass, and spin-coating is performed. The conductive glass is placed on a heating stage of 250 degrees to 300 degrees, and heated to volatilize a solvent; and a polyetherimide film layer is introduced onto the conductive glass.

(3) Photoresist coating, exposure and developing. Spin-coating of photoresist is performed, and red pixels are exposed and developed to expose the red pixels.

(4) Introduction of a mercapto-containing siloxane polymer thin film (the lower fixing layer, i.e., the first fixing layer 2). An ethanol solution (0.5 mL of 3-mercaptopropyl trimethoxysilane and 4.5 mL of ethanol) of 3-mercaptopropyl trimethoxysilane

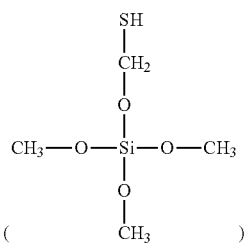

is prepared, a small amount of ammonium hydroxide (0.1 mL) is added into the ethanol solution, 90 μL of the above solution is dropwise dripped on the conductive glass and subjected to spin-coating to form a film, with a rotating speed of 1000-4000 rpm, and the film is placed under the room temperature for 1-2 h. The conductive glass is rinsed with super-dry anhydrous ethanol for 2-3 times. Completing the step in air may get rid of the reliance on an expensive glove box, and the concentration and spin-coating rotating speed of a silane solution are controlled to form a layer of tight silane-coupled silicon oxide thin film on an upper film layer. In addition, a mercapto silane agent in this step may be selected from: 3-mercaptopropyl trimethoxysilane, 3-mercaptopropyl triethoxysilane, 3-mercaptopropyl methyl dimethoxysilane, 3-mercaptopropyl methyl diethyloxysilane, mercaptopropyl silane, 3-mercaptopropyl trimethylsilane, bis-[3-(triethoxysilicon)propyl]-tetrasulfide and other mercapto-containing silane agents.

(5) Spin-coating of a red quantum dot layer. Specific manufacturing steps may be the following.

(a) Preparation of a CdSe kernel: 0.4 mmol of CdO, 3.2 mmol of OA and 10 mL of ODE are added into a 50 mL three-necked round-bottom flask, heating is performed at 120° C., vacuumizing is performed for 1 h, nitrogen is introduced, the temperature is raised to 240° C., and a solution in the three-necked flask is in a clear and transparent state. 1 g of TOP and 3 g of cetylamine are added, the temperature is lowered to 150° C., vacuumizing is performed for 30 min, nitrogen is introduced, and the temperature is raised to 280° C. A TOP-Se settled solution (2 mmol of Se, 2 mL of TOP and 2.5 mL of ODE are stirred in a glove box to form yellow transparent liquid) is rapidly injected, the temperature is preserved for 3 min and then rapidly lowered to the room temperature, multiple times of extraction is performed with a methanol/chloroform solution with a volume ratio of 3:1, and quantum dots are dispersed in chloroform for standby application.

(b) Preparation of a ZnS shell layer precursor: 0.3 mmoL of $Zn(Ac)_2$, 1 mmol of DDT, 6 mL of ODE and 4 mL of OLA are added into a three-necked round-bottom flask, and after three times of heating while stirring at 90° C., vacuumizing and nitrogen introduction, a product is for standby application.

(c) A shell layer cladding process: 2 mL of a CdSe chloroform solution, 2 mL of ODE and 200 μL of OA are added into the three-necked round-bottom flask; after three times of vacuumizing at 120° C. and nitrogen replacement, the temperature is raised to 240° C., and the ZnS shell layer precursor is transferred to a main reaction system at a speed of 1.5 mL/h.

(d) A cleaning process: in order to thoroughly remove free ligands, the cleaning process has three steps: (1) 100 mL of an acetone/methanol mixed solution with a volume ratio of 7:3 is added into a three-necked round-bottom flask containing a quantum dot solution, and after magnetic stirring at 60° C. for 10 min, sediment is obtained through centrifuging; (2) in the three-necked round-bottom flask, the sediment is completely dispersed in 20 mL of toluene, then 100 mL of an acetone/methanol mixed solution with a volume ratio of 3:7 is added, and after magnetic stirring at 60° C. for 10 min, sediment is obtained through centrifuging; and (3) the sediment is completely dispersed in 20 mL of toluene and added into the three-necked round-bottom flask, 20 mL of glacial acetic acid and 70 mL of methanol are added, after stirring at 70° C. for 10 min, sediment is obtained through centrifuging, the sediment is placed in a vacuum drying box to be dried at 60° C., and a 15 mg/ml n-octane solution is prepared for standby application.

(e) Spin-coating of a quantum dot layer: original ligands of quantum dots are oleic acid or oleylamine; and since mercapto of the substrate subjected to 3-mercaptopropyl trimethoxysilane is exposed at the outermost end, and may be combined with the quantum dots, the quantum dots are fixed to the substrate.

(6) Introduction of a mercapto-containing organic polymer thin film (the upper fixing layer, i.e., the second fixing layer (4). Specific manufacturing steps may be the following: due to developing, ultrasonic and other processes in follow-up processes of multi-layer quantum dots, the quantum dots are prone to falling off, modification with a mercapto-containing organic polymer is performed on the top of the quantum dots again, a specific schematic structural diagram is as shown in FIG. 5, and then a layer of polymer thin film is formed to cover the quantum dots through the coordination of mercapto with the quantum dots, so that the quantum dots are free from the impact of the developing and ultrasonic processes.

(7) Peeling off of photoresist. The photoresist is peeled off to form patterned red quantum dots.

(8) Introduction of a hole transfer layer. The hole transfer layer is formed on the conductive glass through spin-coating or evaporation or the like. An organic substance as a hole transfer layer may be selected from TFB (poly(9,9-dioctyl fluorene-co-N-(4-butylphenyl)diphenylamine)), or PVK (polyvinyl carbazole) or other commercial hole transfer compounds. A film-forming condition of TFB is: film forming in inert gas of 130° C. to 150° C. The thickness of the film layer may be regulated according to the rotating speed of the spin coater, and the evaporated hole transfer material may also be used in this step.

(9) Introduction of a hole injection layer. The hole injection layer is formed on the conductive glass through spin-coating or evaporation or the like. An organic substance as the hole injection layer may be selected from PEDOT:PSS 4083 (poly3,4-ethylene dioxythiophene/polystyrenesulfonate) or other commercial compounds suitable for the hole injection layer. A film-forming temperature of PEDOT is 130° C. to 150° C. in air. The thickness of the film layer may be regulated according to the rotating speed of the spin coater, and the evaporated hole injection material may also be used in this step.

(10) Introduction of an anode. Finally, an anode material is introduced, for example, an aluminum film or a silver film is evaporated, or an indium zinc oxide (IZO) film is sputtered to prepare a QLED device.

(11) Packaging. A packaging cover plate is adopted for covering, the device is packaged through ultraviolet curing glue, and thus a QLED is prepared.

(12) Preparation of a full-color QLED. The above steps are repeated to form patterned green and blue pixels so as to form the full-color OLED, and additionally, the patterning order of red quantum dots, green quantum dots and blue quantum dots may also be adjusted as needed.

The embodiments of the present disclosure have the following beneficial effects: in the embodiments of the present disclosure, the first fixing layer is arranged between the substrate assembly and the quantum dot film layer, the first connection structures L1 are arranged between the first fixing layer and the substrate assembly, the second connection structures L2 are arranged between the pattern portions of the quantum dot film layer and the first fixing layer 2, the first connection structures L1 are formed by the reaction between the first coordinating groups R1 connected with the silane coupling agents with multi coordinate bonds A and the first groups Z connected with the substrate assembly 1, and the second connection structures L2 are formed by replacement of the second coordinating groups R2 connected with the silane coupling agents with multi coordinate bonds A and the first ligands Y1 connected with the quantum dots QD. Therefore, the quantum dots QD of the pattern portions can be connected with the substrate assembly 1 through the first fixing layer, and when the quantum dots are patterned, the problems in the prior art that the quantum dots are prone to falling off in the patterning process and formed patterns are irregular can be alleviated.

Apparently, those skilled in the art can perform various changes and modifications on the present disclosure without departing from the spirit and scope of the present disclosure. Therefore, if these changes and modifications on the present disclosure fall in the scope of the claims of the present disclosure and their equivalent technologies, the present disclosure is also intended to contain these changes and modifications.

What is claimed is:

1. A quantum dot device, comprising:
   a substrate assembly;
   a first fixing layer, wherein the first fixing layer is arranged on one side of the substrate assembly and has silane coupling agents with multi coordinate bonds, and a first connection structure is arranged between the first fixing layer and the substrate assembly; and
   a quantum dot film layer, arranged on one side, facing away from the substrate assembly, of the first fixing layer; wherein the quantum dot film layer has a plurality of pattern portions, the plurality of pattern portions comprises quantum dots, and a second connection structure is arranged between the plurality of pattern portions and the first fixing layer;
   wherein the first fixing layer further comprises a third connection structure; and
   different silane coupling agents with multi coordinate bonds are connected with one another through the third connection structure.

2. The quantum dot device according to claim 1, wherein the first fixing layer comprises a following structure:

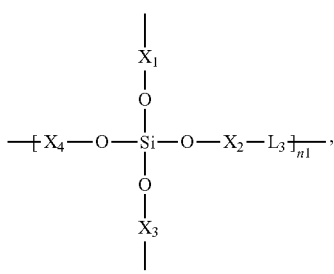

wherein the first connection structure is connected with X3, the second connection structure is connected with X1, L3 is the third connection structure,

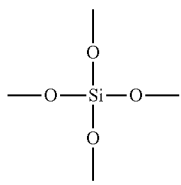

is the silane coupling agent with multi coordinate bonds, n1>1, X1 is an alkyl chain or a single bond, X2 is an alkyl chain or a single bond, X3 is an alkyl chain or a single bond, and X4 is an alkyl chain or a single bond.

3. The quantum dot device according to claim 2, wherein the first connection structure is formed by reaction between a first coordinating group connected with the silane coupling agent with multi coordinate bonds and a first group connected with the substrate assembly; and
the first coordinating group is a methyl group, an ethyl group or a propyl group; and
the first group is hydroxy.

4. The quantum dot device according to claim 2, wherein the substrate assembly comprises a base substrate and a functional layer arranged on one side, facing the first fixing layer, of the base substrate;
a material of the functional layer is zinc oxide; and
the first group is a group connected to the functional layer.

5. The quantum dot device according to claim 2, wherein the second connection structure is formed by replacement of a second coordinating group connected with the silane coupling agent with multi coordinate bonds and a first ligand connected with the quantum dot; and
the second coordinating group is one of:
amino;
polyamino;
hydroxy;
polyhydroxy;
mercapto;
polymercapto;
sulfide;
polysulfide;
phosphine; or
phosphine oxide.

6. The quantum dot device according to claim 5, wherein the second coordinating group is the mercapto, the first ligand is oleic acid or oleylamine, and the second connection structure is —S—.

7. The quantum dot device according to claim 2, wherein the third connection structure is a single bond;

wherein the third connection structure is formed by reaction of two third coordinating groups; and each of the two third coordinating groups is a methyl group, an ethyl group or a propyl group.

8. The quantum dot device according to claim 1, further comprising: a second fixing layer arranged on one side, facing away from the first fixing layer, of the quantum dot film layer;
wherein a fourth connection structure is arranged between the second fixing layer and the quantum dot film layer.

9. The quantum dot device according to claim 8, wherein the second fixing layer comprises a connection body;
the fourth connection structure is formed by replacement of a fourth coordination terminal group connected with the connection body and a second ligand connected with the quantum dot; and
the second fixing layer comprises a following structure:

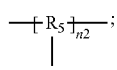

wherein the fourth connection structure is connected with R5, and n2>1.

10. The quantum dot device according to claim 9, wherein the second fixing layer comprises a following structure:

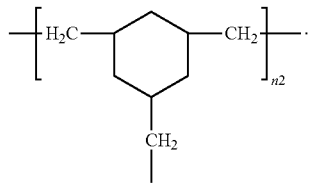

11. The quantum dot device according to claim 8, wherein the second fixing layer comprises a connection body;
the fourth connection structure is formed by replacement of a fourth coordinating group connected with the connection body and a second ligand connected with the quantum dot; and
the second fixing layer comprises a following structure:

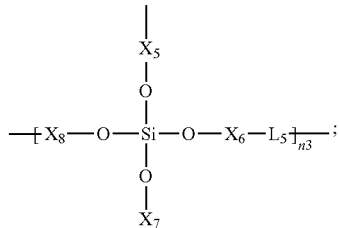

wherein the fourth connection structure is connected with X5, L5 is a fifth connection structure, n3>1, X5 is an alkyl chain or a single bond, X6 is an alkyl chain or a single bond, X7 is a methyl group, an ethyl group or a propyl group, and X8 is an alkyl chain or a single bond.

12. The quantum dot device according to claim 9, wherein the fourth coordinating group is one of:
amino;
polyamino;
hydroxy;

polyhydroxy;
mercapto;
polymercapto;
sulfide;
polysulfide;
phosphine; or
phosphine oxide.

13. The quantum dot device according to claim 12, wherein the fourth coordinating group is the mercapto, the second ligand is oleic acid or oleylamine, and the fourth connection structure is —S—.

14. A display apparatus, comprising the quantum dot device according to claim 1.

15. A manufacturing method for the quantum dot device according to claim 1, comprising:
    providing the substrate assembly, wherein the substrate assembly comprises a first group;
    forming a patterned photoresist layer on one side of the substrate assembly, wherein the patterned photoresist layer exposes a target region of the substrate assembly where the quantum dots are to be formed;
    forming a first film layer on one side, facing away from the substrate assembly, of the photoresist layer; wherein the first film layer comprises a silane coupling agent with multi coordinate bonds and a first coordinating group and a second coordinating group connected with the silane coupling agent with multi coordinate bonds, to make the first coordinating group and the first group of the target region react to form the first connection structure;
    forming a quantum dot thin film on one side, facing away from the photoresist layer, of the first film layer; wherein the quantum dot thin film comprises a quantum dot and a first ligand connected with the quantum dot, to make the second coordinating group and the first ligand react to form the second connection structure, and make the quantum dot thin film of the target region is connected with the substrate assembly through the first connection structure and the second connection structure; wherein the first film layer after reaction between the second coordinating group and the first ligand is used as the first fixing layer; and
    removing the photoresist layer and the quantum dot thin film attached to the photoresist layer to form the quantum dot film layer comprising the plurality of pattern portions.

16. The manufacturing method according to claim 15, wherein the quantum dot film layer further comprises a second ligand connected with the quantum dot;
    wherein after forming the quantum dot thin film on the side, facing away from the photoresist layer, of the first film layer and before removing the photoresist layer, the manufacturing method further comprises:
    forming a second film layer on one side, facing away from the first film layer, of the quantum dot thin film;
    wherein the second film layer comprises a connection body and a fourth coordinating group connected with the connection body, to make the fourth coordinating group and the second ligand have replacement reaction to form a fourth connection structure; wherein the second film layer after the replacement reaction between the fourth coordinating group and the second ligand is used as a second fixing layer.

17. The manufacturing method according to claim 16, wherein the forming the first film layer on the side, facing away from the substrate assembly, of the photoresist layer comprises:
    preparing an ethanol solution of a mercapto-containing siloxane polymer, and adding a small amount of ammonium hydroxide to the ethanol solution to form first mixed liquor;
    wherein a structural formula of the siloxane polymer is

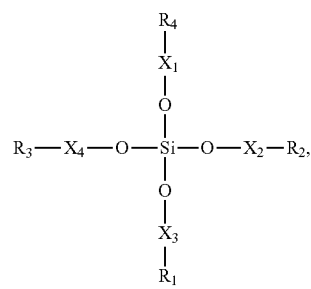

wherein R4 is mercapto, R2 is a methyl group, an ethyl group or a propyl group, R3 is a methyl group, an ethyl group or a propyl group, R1 is a methyl group, an ethyl group or a propyl group, X1 is an alkyl chain or a single bond, X2 is an alkyl chain or a single bond, X3 is an alkyl chain or a single bond, and X4 is an alkyl chain or a single bond;
    taking the first mixed liquor to be dropwise dripped on the photoresist layer to form a mercapto-containing siloxane polymer thin film, and placing the thin film under a room temperature for a first duration; and
    rinsing with super-dry anhydrous ethanol in air for at least 2 times.

18. The manufacturing method according to claim 16, wherein the forming the second film layer on the side, facing away from the first film layer, of the quantum dot thin film comprises:
    forming a thin film with a same material as the first film layer on one side, facing away from the first film layer, of the quantum dot thin film, to have replacement reaction of oleic acid or an oleylamine ligand of the quantum dot and the mercapto, to form a layer of siloxane polymer thin film covering the quantum dot film layer.

19. The manufacturing method according to claim 16, wherein the forming the second film layer on the side, facing away from the first film layer, of the quantum dot thin film comprises:
    forming a mercapto-containing organic polymer thin film on one side, facing away from the first film layer, of the quantum dot thin film, to have replacement reaction of oleic acid or an oleylamine ligand of the quantum dot and the mercapto, to form a layer of polymer thin film covering the quantum dot film layer, wherein a structural formula of the organic polymer thin film

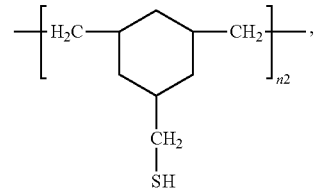

wherein $n2>1$.

20. A quantum dot device, comprising:
a substrate assembly;
a first fixing layer, wherein the first fixing layer is arranged on one side of the substrate assembly and has silane coupling agents with multi coordinate bonds, and a first connection structure is arranged between the first fixing layer and the substrate assembly;
a quantum dot film layer, arranged on one side, facing away from the substrate assembly, of the first fixing layer; wherein the quantum dot film layer has a plurality of pattern portions, the plurality of pattern portions comprise quantum dots, and a second connection structure is arranged between the plurality of pattern portions and the first fixing layer; and
a second fixing layer arranged on one side, facing away from the first fixing layer, of the quantum dot film layer; wherein a fourth connection structure is arranged between the second fixing layer and the quantum dot film layer.

* * * * *